(12) United States Patent
Hwang

(10) Patent No.: US 8,860,915 B2
(45) Date of Patent: Oct. 14, 2014

(54) DISPLAY DEVICE

(75) Inventor: Eui-Hoon Hwang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 607 days.

(21) Appl. No.: 12/984,108

(22) Filed: Jan. 4, 2011

(65) Prior Publication Data

US 2011/0164214 A1    Jul. 7, 2011

(30) Foreign Application Priority Data

Jan. 7, 2010   (KR) .......................... 10-2010-0001341

(51) Int. Cl.
*G02F 1/1333*  (2006.01)
*H01L 27/32*  (2006.01)

(52) U.S. Cl.
CPC ................................. *H01L 27/3276* (2013.01)
USPC ........................................................ 349/138

(58) Field of Classification Search
None
See application file for complete search history.

(56) References Cited

U.S. PATENT DOCUMENTS

| 7,385,661 B2* | 6/2008 | Chae ............................ 349/141 |
| 7,642,651 B2 | 1/2010 | Albertson et al. |

FOREIGN PATENT DOCUMENTS

| JP | 05036684 A | | 2/1993 |
| JP | 10153794 A | * | 6/1998 |
| JP | 2006222324 | | 8/2006 |
| KR | 1019990047944 A | | 7/1999 |
| KR | 1020050012958 A | | 2/2005 |
| KR | 1020070065551 A | | 6/2007 |
| KR | 100752186 B1 | | 8/2007 |

* cited by examiner

*Primary Examiner* — Sarah Hahm
(74) *Attorney, Agent, or Firm* — Robert E. Bushnell, Esq.

(57) ABSTRACT

A display device includes a substrate, an insulation layer arranged on the substrate and spaced apart from the substrate and including a plurality of stepped portions recessed from a top surface, a first line arranged on the top surface of the insulation layer and a second line comprised of a same material as the first line and being arranged in the stepped portions and having a level difference from the first line.

8 Claims, 9 Drawing Sheets

DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 7 Jan. 2010 and there duly assigned Serial No. 10-2010-0001341.

BACKGROUND OF THE INVENTION

1. Field of the Invention

The described technology relates generally to an organic light emitting diode display device including an organic emission layer.

2. Description of the Related Art

A display device is a device that displays an image. Recently, an organic light emitting diode display has been drawing attention. Unlike a liquid crystal display, an organic light emitting diode display is a self-luminous characteristic, and because the organic light emitting diode display does not need a separate light source, it can have a relatively small thickness and weight. In addition, the organic light emitting diode display exhibits high-quality characteristics, such as low power consumption, high luminance, high response speed, etc.

SUMMARY OF THE INVENTION

One exemplary embodiment has been made to provide a display device that can prevent a short circuit between adjacent lines, even when the interval between the adjacent lines is small and unwanted particles are located at positions at which the adjacent lines are to be formed.

To achieve the above technical solution, an aspect of the present invention provides a display device that includes a substrate, an insulation layer arranged on the substrate and spaced apart from the substrate and including a plurality of stepped portions recessed from a top surface, a first line arranged on the top surface of the insulation layer and a second line comprised of a same material as the first line and being arranged in the stepped portions and having a level difference from the first line.

The display device may also include a thin film transistor that includes a source electrode arranged on the insulating layer and extending from the second line and receiving signals from the second line. The thin film transistor may also include an active layer covered by the insulation layer, the insulation layer may also include a plurality of through holes corresponding to the active layer and penetrating the insulation layer, and the source electrode may be connected to the active layer via one of the through holes.

The stepped portions may be produced simultaneously with the through holes. The stepped portions may penetrate the insulation layer. The insulation layer may include a first sub-insulation layer arranged on the substrate and a second sub-insulation layer arranged on the first sub-insulation layer. The second sub-insulation layer may include first openings penetrating the second sub-insulation layer, and the stepped portions may be formed by the first openings. The first sub-insulation layer may include second openings penetrating the first sub-insulation layer and the stepped portions may be formed by the first openings and the second openings. The thin film transistor may also include a drain electrode connected to the active layer, and the display device may also include a first electrode connected to the drain electrode, an organic emission layer arranged on the first electrode and a second electrode arranged on the organic emission layer.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
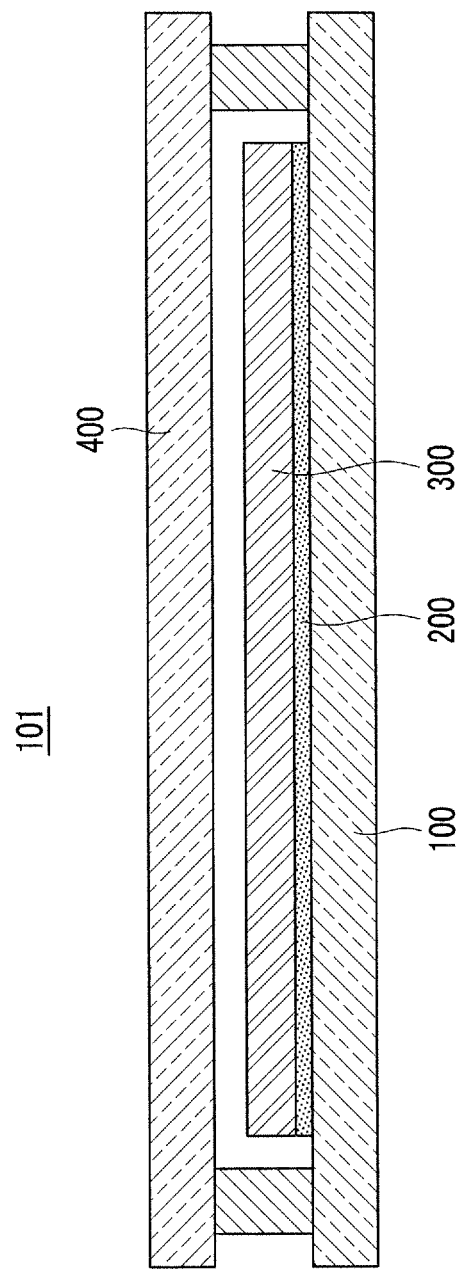
FIG. 1 is a cross-sectional view showing an organic light emitting diode display device according to a first exemplary embodiment.

Hereinafter, exemplary embodiments will be described in detail with reference to the accompanying drawings such that those skilled in the art can easily carry out the present invention. As those skilled in the art would realize, the described embodiments may be modified in various different ways, all without departing from the spirit or scope of the present invention.

To clearly describe the exemplary embodiments, parts not related to the description are omitted, and like reference numerals designate like constituent elements throughout the specification.

Constituent elements having the same structures throughout the embodiments are denoted by the same reference numerals and are described in a first exemplary embodiment. In the other exemplary embodiments, only constituent elements other than the same constituent elements are described.

In the drawings, the sizes and thicknesses of the components are merely shown for convenience of explanation, and therefore the present invention is not necessarily limited to the illustrations described and shown herein.

In the drawings, the thickness of layers, films, panels, regions, etc., are exaggerated for clarity. In the drawings, the thicknesses of some layers and areas are exaggerated for convenience of explanation. When it is described that one element such as a layer, a film, an area, a plate, etc. is formed on another element, it means that one element exists right on another element or that one element exists on another element with a further element therebetween.

Throughout this specification and the claims that follow, unless explicitly described to the contrary, the word "comprise" and variations such as "comprises" or "comprising"

will be understood to imply the inclusion of stated elements but not the exclusion of any other elements. Throughout this specification, it is understood that the term "on" and similar terms are used generally and are not necessarily related to a gravitational reference.

Although the following description will be given with respect to an organic light emitting diode display device as a typical example of a display device according to one exemplary embodiment, a display device according to another exemplary embodiment may be a liquid crystal display device (LCD), a plasma display panel (PDP), or a field emission display (FED).

A display device is a device that displays an image. Recently, an organic light emitting diode display has been drawing attention. Unlike a liquid crystal display, an organic light emitting diode display is self-luminous, and because the organic light emitting diode display does not need a separate light source, it can have a relatively small thickness and weight. In addition, the organic light emitting diode display exhibits high-quality characteristics, such as low power consumption, high luminance, high response speed, etc.

A conventional organic light emitting diode display device includes a plurality of thin film transistors and a plurality of lines connected to the thin film transistors, and has a problem of short circuiting between the adjacent lines because the distance between the adjacent lines to be connected to the plurality of thin film transistors is small. Particularly, in the case where unwanted particles are present before the formation of the adjacent lines and at locations at which adjacent lines are to be formed, these particles cause a short circuit between the adjacent lines.

Hereinafter, a display device 101 according to a first exemplary embodiment will be described with reference to FIGS. 1 to 5. An insulating layer as claimed in the claims will be described by taking an interlayer insulation layer as an example, a first line will be described by taking a data line as an example, a second line will be described by taking a common power line as an example, a thin film transistor will be described by taking a driving thin film transistor as an example, a source electrode will be described by taking a driving source electrode as an example, a drain electrode will be described by taking a driving drain electrode as an example, and an active layer will be described by taking a driving semiconductor layer as an example.

FIG. 1 is a cross-sectional view showing an organic light emitting diode display device according to a first exemplary embodiment. As shown in FIG. 1, the organic light emitting diode display device 101 according to the first exemplary embodiment includes a first substrate 100, a wiring portion 200, an organic light emitting diode 300, and a second substrate 400.

The first substrate 100 and the second substrate 400 are light transmissive and electrically insulating substrates that can be made out of glass, polymer, or the like. The first substrate 100 and the second substrate 400 face each other, and are bonded together by a sealant. The wiring portion 200 and the organic light emitting diode 300 are positioned between the first substrate 100 and the second substrate 400, and the first substrate 100 and the second substrate 400 protect the wiring portion 200 and the organic light emitting diode 300 from external interference.

The wiring portion 200 includes switching and driving thin film transistors 10 and 20 (shown in FIG. 2), and transmit signals to the organic light emitting diode 300 to drive the organic light emitting diode 300. The organic light emitting diode 300 emits light according to signals received from the wiring portion 200.

The organic light emitting element 300 is positioned on the wiring portion 200. The organic light emitting diode 300 is also positioned in a display area on the first substrate 100. The organic light emitting diode 300 receives a signal from the wiring portion 200, and displays an image according to the received signal.

Figure 2:
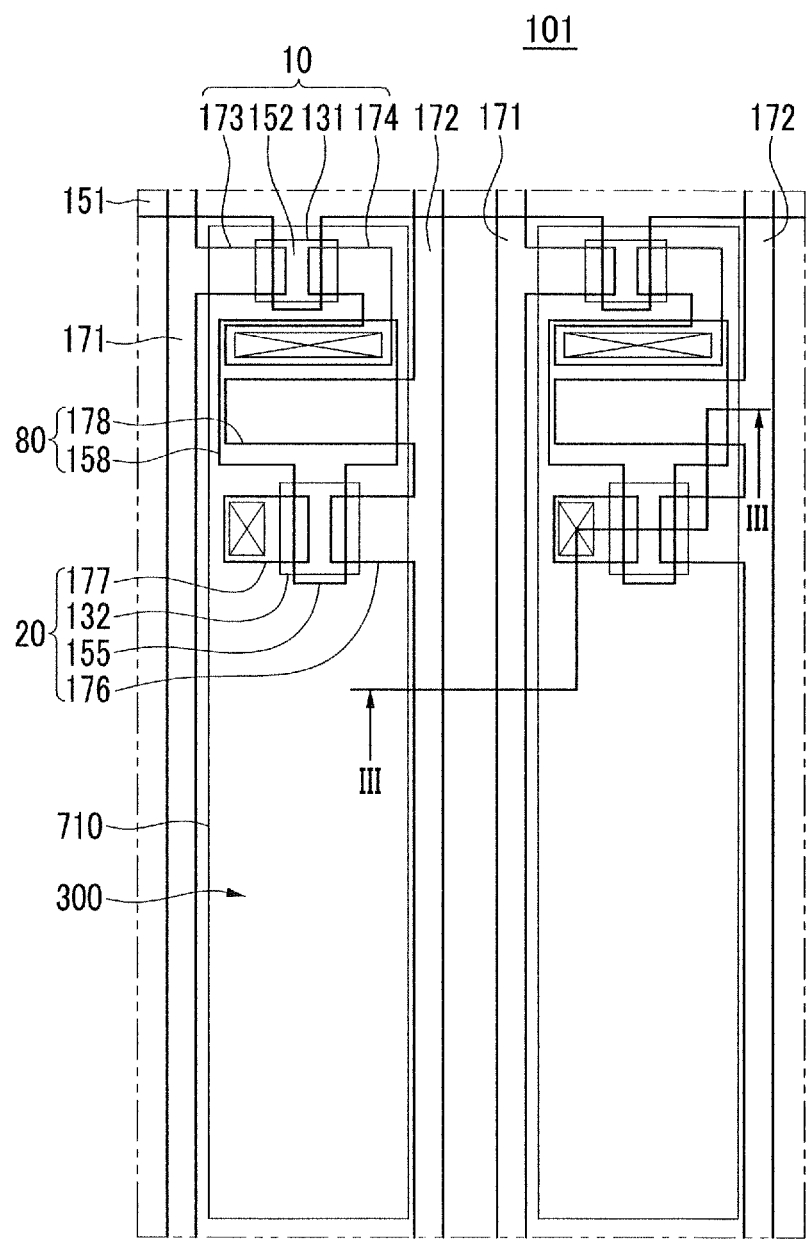
FIG. 2 is a layout view showing the structure of a pixel of the organic light emitting diode display according to the first exemplary embodiment.
Figure 3:
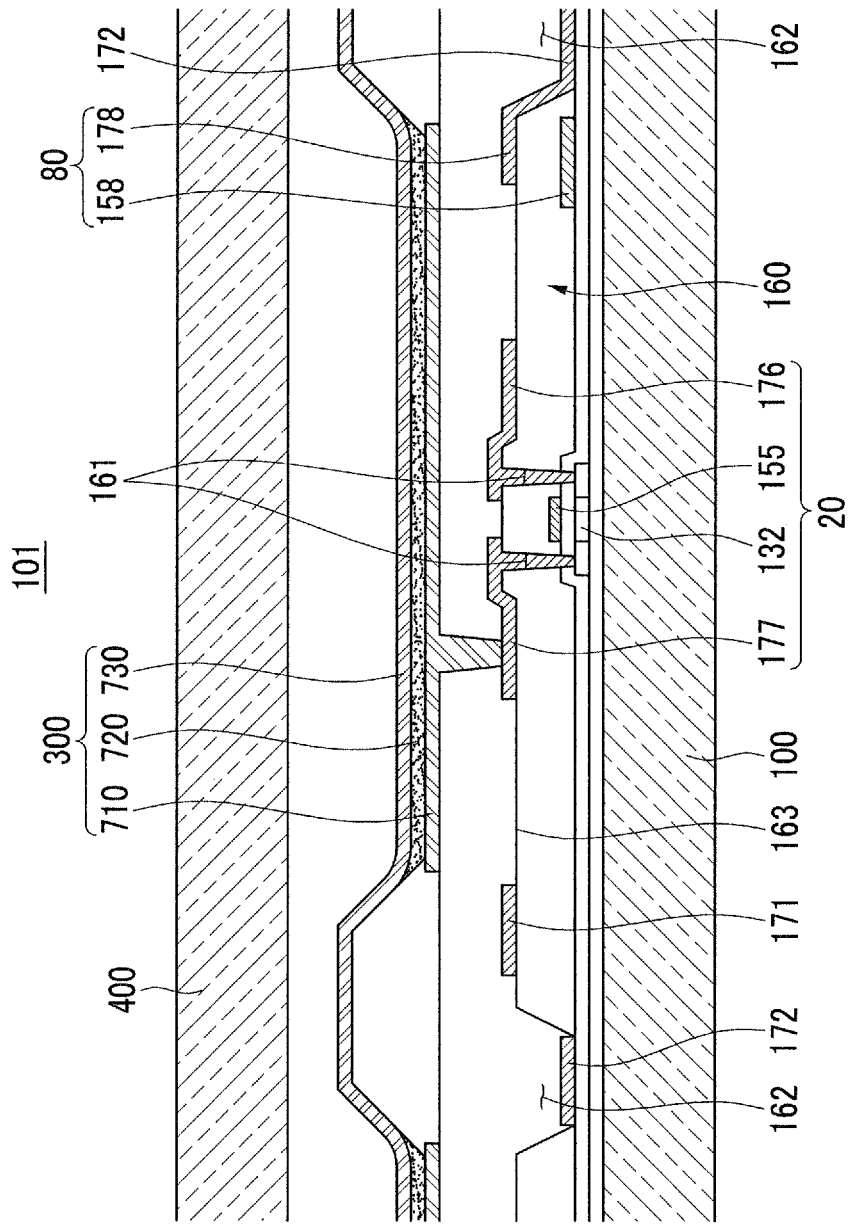
FIG. 3 is a cross-sectional view taken along line of FIG. 2.

Now, the internal structure of the organic light emitting diode display device 101 according to the first exemplary embodiment will be described in detail with reference to FIGS. 2 and 3. FIG. 2 is a layout view showing the structure of a pixel of the organic light emitting diode display according to the first exemplary embodiment and FIG. 3 is a cross-sectional view taken along line of FIG. 2. A pixel refers to the smallest unit displaying an image, and the display device displays an image through a plurality of pixels.

Concrete structures of the wiring portion 200 and the organic light emitting diode 300 are shown in FIGS. 2 and 3, but an exemplary embodiment is not limited to the structures shown in FIGS. 2 and 3. The wiring portion 200 and the organic light emitting diode 300 may instead have other various structures and still be within the scope of the present invention. For example, although the accompanied drawings illustrate an active matrix (AM)-type organic light emitting diode display having a 2Tr-1Cap structure as a display device in which one pixel includes two thin film transistors (TFTs) and one capacitor, the present invention is not limited thereto. Therefore, the number of thin film transistors, the number of capacitors, and the number of lines in the display device are not limited.

As shown in FIGS. 2 and 3, each pixel of the organic light emitting diode display device 101 includes a switching thin film transistor 10, a driving thin film transistor 20, a capacitor 80, and an organic light emitting diode 300. Here, a component including the switching thin film transistor 10, the driving thin film transistor 20, and the capacitor 80 is referred to as the wiring portion 200. The wiring portion 200 further includes a gate line 151 arranged along one direction on the first substrate 100, a data line 171 insulated from and crossing the gate line 151, and a common power line 172. One pixel may be defined by the gate line 151, the data line 171, and the common line 172, but the present invention is not necessarily limited thereto.

The organic light emitting diode 300 includes a first electrode 710, an organic emission layer 720 positioned on the first electrode 710, and a second electrode 730 positioned on the organic emission layer 720. The first electrode 710 is an anode serving as a hole injection electrode, and the second electrode 730 is a cathode serving as an electron injection electrode, however, the first exemplary embodiment is not necessarily limited thereto. For example, the first electrode 710 may instead be a cathode and the second electrode 730 may instead be an anode according to a driving method of the organic light emitting diode display device 101. That is, holes and electrons are injected into the organic emission layer 720 from the first electrode 710 and the second electrode 730, respectively, and when excitons formed by recombinations of the injected holes and electrons drop from an excited state to a ground state, the organic emission layer 720 emits light. Moreover, at least one of the first electrode 710 and the second electrode 730 transmits light and the other reflects light. At least one of the first electrode 710 and the second electrode 730 includes a one or more semi-transmissive conductive layers containing at least one of lithium (Li), aluminum (Al), calcium (Ca), magnesium (Mg), silver (Ag), magnesium-silver (MgAg), lithium aluminum (LiAl), indium tin oxide (ITO), and indium zinc oxide (IZO).

As such, in the organic light emitting diode display device 101 according to the first exemplary embodiment, the organic light emitting diode 300 emits light in at least one of the directions of the first substrate 100 and the second substrate 400. That is, the organic light emitting diode display device 101 may be a top-emission type, a bottom-emission type, or a dual-emission type.

The capacitor 80 includes a pair of capacitor plates 158 and 178 arranged with an interlayer insulation layer 160 interposed therebetween. Here, the interlayer insulation layer 160 is a dielectric material, and the storage capacity of the capacitor 80 is determined by the electric charges stored in the capacitor 80 and the voltage between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switching element to select a pixel to emit light. The switching gate electrode 152 is connected to the gate line 151, the switching source electrode 173 is connected to the data line 171 and the switching drain electrode 174 is spaced apart from the switching source electrode 173 and connected to capacitor plate 158.

The driving thin film transistor 20 receives driving power, which is a signal for allowing the organic emission layer 720 of the organic light emitting diode 300 to emit light, from the common power line 172, and applies it to the first electrode 710. The driving gate electrode 155 is connected to the capacitor plate 158 which is connected to the switching drain electrode 174. The driving source electrode 176 and the other capacitor plate 178 are connected to the common power line 172 and extend from the common power line 172. The driving drain electrode 177 is connected to the first electrode 710 of the organic light emitting diode 300 via a contact hole. The driving source electrode 176 and the driving drain electrode 177 are connected to the driving semiconductor layer 132 via through holes 161 penetrating the interlayer insulation layer 160.

With the above-described configuration, the switching thin film transistor 10 is driven by a gate voltage applied to the gate line 151, and supplies a data voltage applied to the data line 171 to the driving thin film transistor 20. A voltage corresponding to the difference between the common voltage, which is supplied from the common power line 172 to the driving thin film transistor 20, and the data voltage, which is supplied from the switching thin film transistor 10, is stored in the capacitor 80. A current corresponding to the voltage stored in the capacitor 80 flows into the organic light emitting diode 300 through the driving thin film transistor 20 to make the organic light emitting diode 300 emit light.

Meanwhile, the interlayer insulation layer 160 serves as an insulation layer, and includes a surface 163 spaced apart from the first substrate 100 and stepped portions 162 recessed from the surface 163. The data line 171, the switching source electrode 173, the switching drain electrode 174, the driving source electrode 176, the driving drain electrode 177, and the capacitor plate 178 are arranged on the surface 163 of the interlayer insulation layer 160, and the common power line 172 is arranged in the stepped portions 162 at which the interlayer insulation layer 160 is opened. The stepped portions 162 penetrate the interlayer insulation layer 160, and are formed simultaneously with the through holes 161 formed in the interlayer insulation layer 160 such that the driving source electrode 176 and the driving drain electrode 177 are connected to the driving semiconductor layer 132. The data line 171, the switching source electrode 173, the switching drain electrode 174, the driving source electrode 176, the driving drain electrode 177, the capacitor plate 178, and the common power line 172 are made out of the same conductive material because they are formed by etching the same metal layer produced by a micro-electro-mechanical systems (MEMS) process, such as photolithography. Although the data line 171 and the common power line 172 are adjacent to each other between adjacent pixels, the data line 171 is formed on the surface 163 of the interlayer insulation layer 160 and the common power line 172 is formed in the stepped portions 162 penetrating the interlayer insulation layer 160, thereby forming a level difference between the data line 171 and the common power line 172.

As such, by forming a level difference between the data line 171 and the common power line 172, the organic light emitting diode display device 101 according to the first exemplary embodiment prevents a short circuit between the data line 171 and the common power line 172 adjacent to each other even when the distance between the data line 171 and the common power line 172 is small.

Figure 4:
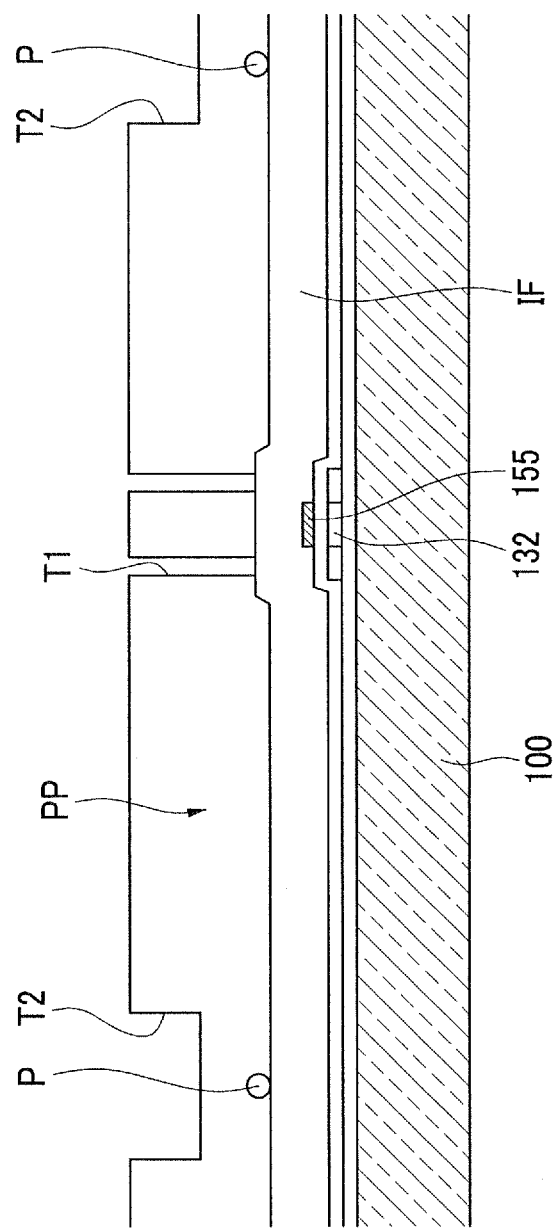
FIGS. 4 and 5 are views showing a manufacturing process of forming an interlayer insulation layer of the organic light emitting diode display device according to the first exemplary embodiment.
Figure 5:
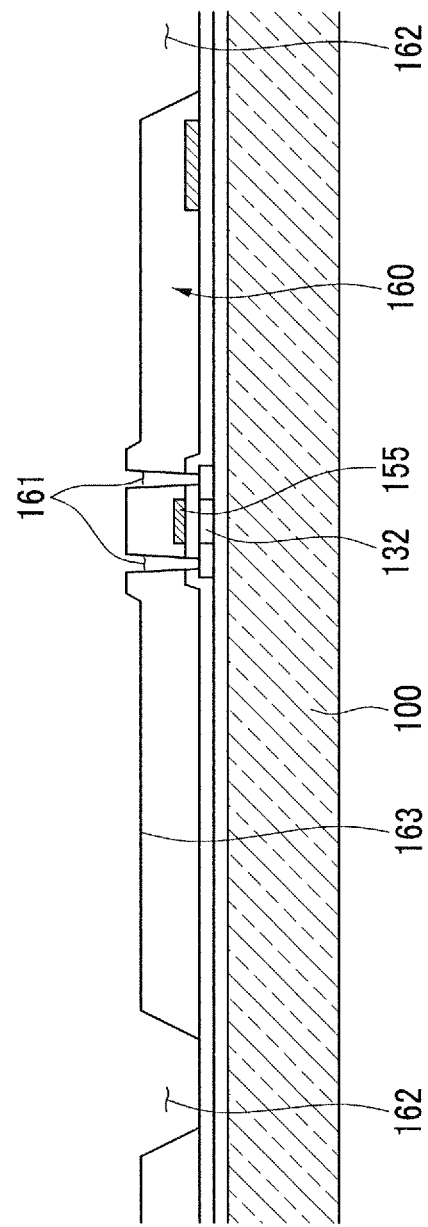

Moreover, even in the case where, before the formation of the data line 171 and the common power line 172 adjacent to each other, unwanted particles are located at positions at which the adjacent lines are to be formed, it is possible to prevent a short circuit between the data line 171 and the common power line 172 adjacent to each other due to the particles, which will be described below in detail with reference to FIGS. 4 and 5 showing a manufacturing process of forming the interlayer insulation layer 160.

FIGS. 4 and 5 are views showing a manufacturing process of forming an interlayer insulation layer 160 of the organic light emitting diode display device 101 according to the first exemplary embodiment. As shown in FIG. 4, first a driving semiconductor layer 132, a driving gate electrode 155, etc. are formed on a first substrate 100, and then an insulating film IF including a nitride such as SiNx or an oxide such as SiOx is formed on the driving gate electrode 155. Particles P may be located on the insulating film IF during or after the process of forming the insulating film IF.

Next, a photoresist layer including a photoresist is formed on the insulating film IF, and then the photoresist layer is selectively exposed and developed using a half-tone mask, a slit mask, or an opaque mask to form a photoresist pattern PP including a first pattern T1 corresponding to portions where through holes 161 are to be formed and a second pattern T2 corresponding to portions where stepped portions 162 are to be formed. At this point, the first pattern T1 is formed deeper than the second pattern T2, and the particles P located on the insulating film IF are covered by the photoresist pattern PP.

Next, as shown in FIG. 5, the interlayer insulation layer 160 including the stepped portions 162 and the through holes 161 are formed by dry-etching the insulating film IF using the photoresist pattern PP including the first pattern T1 and the second pattern T2 each having a selective depth and then ashing or lifting off the photoresist pattern PP. As such, as the stepped portions 162 are formed and as the photoresist pattern PP is ashed or lifted off, the particles P located on the insulating film IF are removed from the insulating film IF.

As above, in forming the interlayer insulation layer 160, even in the case where, before the formation of the data line 171 and the common power line 172 adjacent to each other, unwanted particles P are located at positions where the adjacent lines are to be formed, the particles P are removed as the interlayer insulation layer 160 is formed, thereby preventing a short circuit between the data line 171 and the common power line 172.

Figure 6:
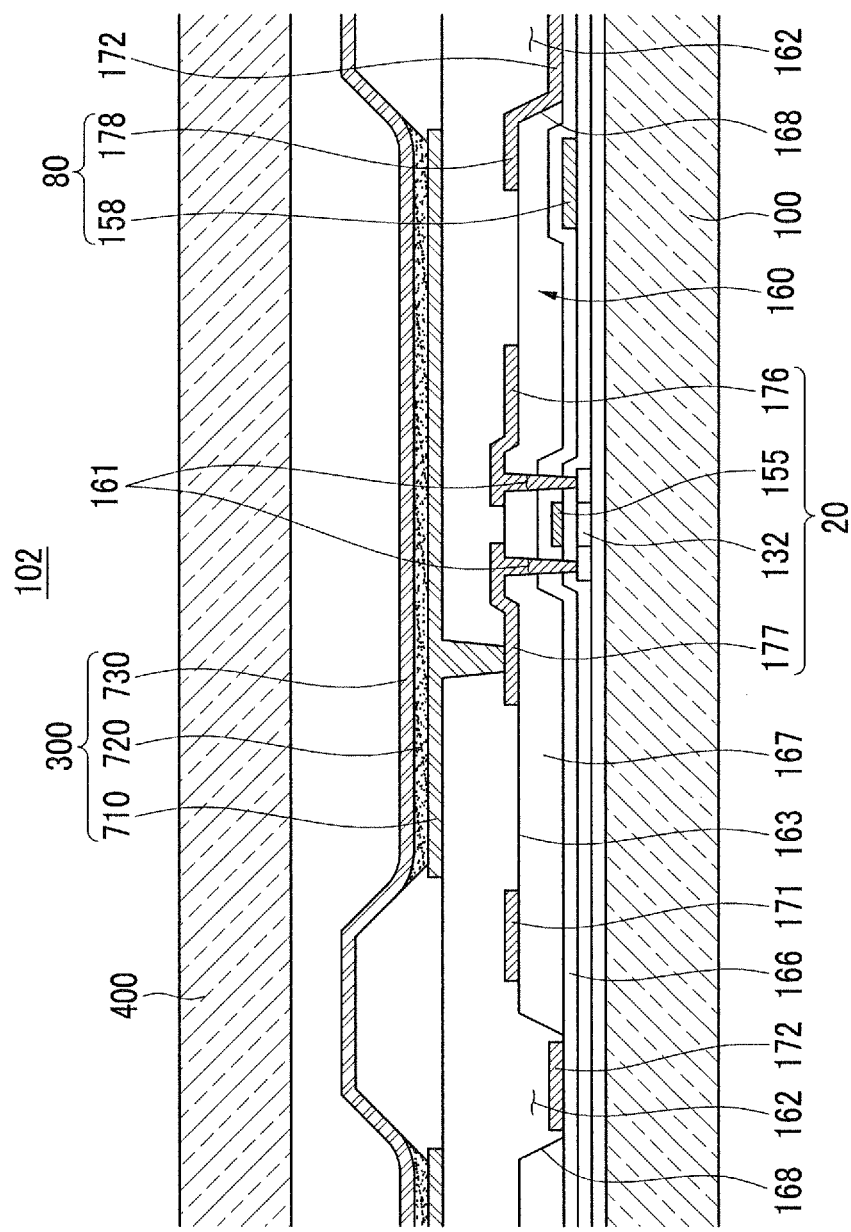
FIG. 6 is a cross-sectional view showing the main parts of an organic light emitting diode display device according to a second exemplary embodiment.

Now, an organic light emitting diode display device 102 according to a second exemplary embodiment will be described with reference to FIG. 6. FIG. 6 is a cross-sectional view showing the main parts of an organic light emitting diode display device 102 according to the second exemplary embodiment.

As shown in FIG. 6, the interlayer insulation layer 160 of the organic light emitting diode display device 102 according to the second exemplary embodiment serves as an insulation layer, and includes a first sub-insulation layer 166 arranged on the first substrate 100 and a second sub-insulation layer 167 arranged on the first sub-insulation layer 166. The second sub-insulation layer 167 includes first openings 168 corresponding to the common power line 172 and penetrating the second sub-insulation layer 167, and the first sub-insulation layer 166 is exposed by the first openings 168. That is, the first openings 168 penetrate the second sub-insulation layer 167 to expose the first sub-insulation layer 166, so that the stepped portions 162 are formed by the first openings 168.

The data line 171, the switching source electrode 173, the switching drain electrode 174, the driving source electrode 176, the driving drain electrode 177, and the capacitor plate 178 are arranged on the surface 163 of the second sub-insulation layer 167, and the common power line 172 is arranged on the first sub-insulation layer 166 corresponding to the stepped portions 162 formed in the first openings 168. As such, although the data line 171 and the common power line 172 are adjacent to each other between adjacent pixels, the data line 171 is formed on the surface 163 of the second sub-insulation layer 167 and the common power line 172 is formed on the surface of the first sub-insulation layer 166 exposed by the first openings 168 in the second sub-insulation layer 167, thereby forming a level difference between the data line 171 and the common power line 172 arranged adjacent to each other.

Therefore, by forming a level difference between the data line 171 and the common power line 172, the organic light emitting diode display device 102 according to the second exemplary embodiment prevents a short circuit between the data line 171 and the common power line 172 adjacent to each other even if the interval between the data line 171 and the common power line 172 is small.

Moreover, even in the case where, before the formation of the data line 171 and the common power line 172 adjacent to each other, unwanted particles are located at positions at which the adjacent lines are to be formed, it is possible to prevent a short circuit between the data line 171 and the common power line 172 adjacent to each other due to the particles.

Figure 7:
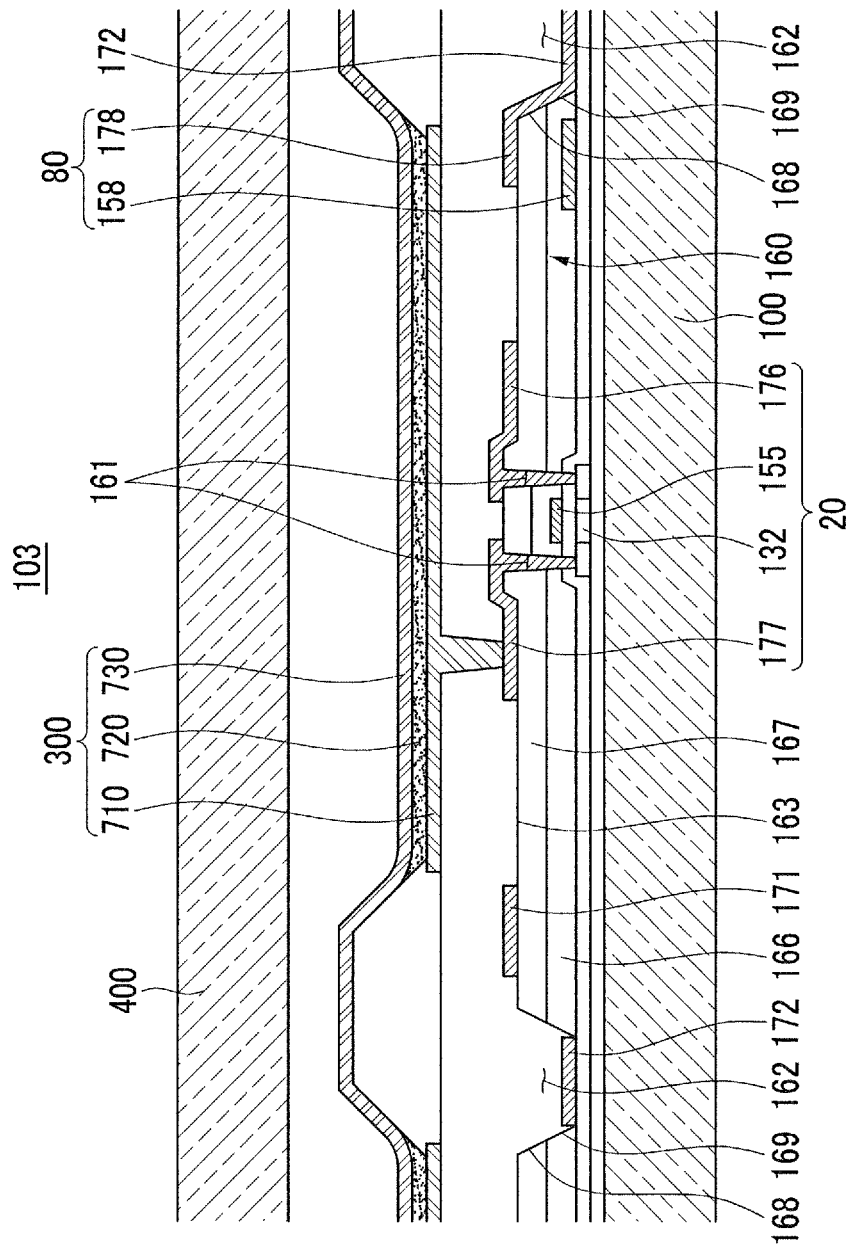
FIG. 7 is a cross-sectional view showing the main parts of an organic light emitting diode display device according to a third exemplary embodiment.

Now, an organic light emitting diode display device according to a third exemplary embodiment will be described with reference to FIG. 7. FIG. 7 is a cross-sectional view showing the main parts of an organic light emitting diode display device 103 according to the third exemplary embodiment.

As shown in FIG. 7, the interlayer insulation layer 160 of the organic light emitting diode display device 103 according to the third exemplary embodiment serves as an insulation layer, and includes a first sub-insulation layer 166 arranged on the first substrate 100 and a second sub-insulation layer 167 arranged on the first sub-insulation layer 166. The second sub-insulation layer 167 includes first openings 168 corresponding to the common power line 172 and penetrating the second sub-insulation layer 167, and the first sub-insulation layer 166 includes second openings 169 corresponding to the common power line 172 and penetrating the first sub-insulation layer 166. That is, the first openings 168 penetrate the second sub-insulation layer 167 and the second openings 169 penetrate the first sub-insulation layer 166, so that the stepped portions 162 are formed by the first openings 168 and the second openings 169.

The data line 171, the switching source electrode 173, the switching drain electrode 174, the driving source electrode 176, the driving drain electrode 177, and the capacitor plate 178 are arranged on the surface 163 of the second sub-insulation layer 167, and the common power line 172 is arranged in the stepped portions 162 formed by first openings 168 and second openings 169. As such, although the data line 171 and the common power line 172 are adjacent to each other between adjacent pixels, the data line 171 is formed on the surface 163 of the second sub-insulation layer 167 and the common power line 172 is formed in the stepped portions 162 formed by the first openings 168 of the second sub-insulation layer 167 and the second openings 169 of the first sub-insulation layer 166, thereby forming a level difference between the data line 171 and the common power line 172 arranged adjacent to each other.

Therefore, by forming a level difference between the data line 171 and the common power line 172, the organic light emitting diode display device 103 according to the third exemplary embodiment prevents a short circuit between the data line 171 and the common power line 172 arranged adjacent to each other, even when the interval between the data line 171 and the common power line 172 is small.

Moreover, even in the case where, before the formation of the data line 171 and the common power line 172 adjacent to each other, unwanted particles are located at positions at which the adjacent lines are to be formed, it is possible to prevent a short circuit between the data line 171 and the common power line 172 caused by the particles.

While the common power line 172 and the data line 171 of the organic light emitting diode display device according to the first to third exemplary embodiments form a level difference therebetween since the common power line 172 is arranged in the stepped portions 162, the common power line 172 and the data line 171 of an organic light emitting diode display device according to a fourth exemplary embodiment may form a level difference therebetween since the data line 171 instead of the common power line 172 is arranged in the stepped portions 162.

Figure 8:
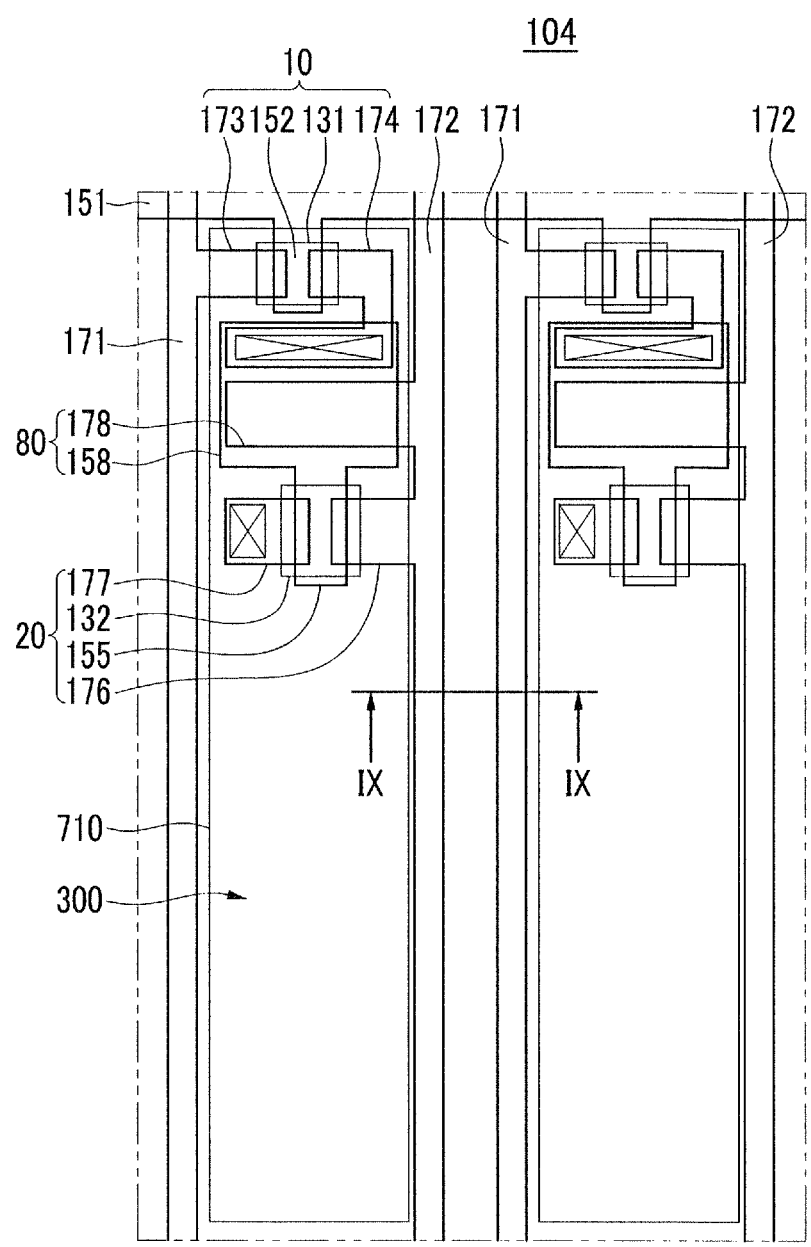
FIG. 8 is a cross-sectional view showing the main parts of an organic light emitting diode display device according to a fourth exemplary embodiment.
Figure 9:
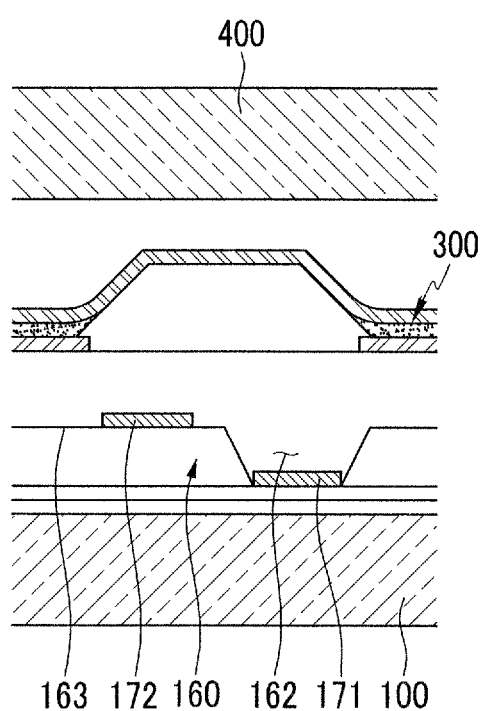
FIG. 9 is a cross-sectional view taken along line IX-IX of FIG. 8.

Now, an organic light emitting diode display device according to the fourth exemplary embodiment will be described with reference to FIGS. 8 and 9. FIG. 8 is a cross-sectional view showing the main parts of an organic light emitting diode display device according to the fourth exemplary embodiment. FIG. 9 is a cross-sectional view taken along line IX-IX of FIG. 8.

As shown in FIGS. 8 and 9, the interlayer insulation layer 160 of the organic light emitting diode display device 104 according to the fourth exemplary embodiment serves as an insulation layer, and includes a surface 163 spaced apart from the first substrate 100 and stepped portions 162 recessed from the surface 163. The common power line 172, the switching source electrode 173, the switching drain electrode 174, the driving source electrode 176, the driving drain electrode 177, and the capacitor plate 178 are arranged on the surface 163 of the interlayer insulation layer 160, and the data line 171 is arranged on the stepped portions 162 at which the interlayer insulation layer 160 is opened. The stepped portions 162 penetrate the interlayer insulation layer 160, and are formed simultaneously with the through holes 161 formed in the interlayer insulation layer 160 such that the driving source electrode 176 and the driving drain electrode 177 can be electrically connected to the driving semiconductor layer 132. The data line 171, the switching source electrode 173, the switching drain electrode 174, the driving source electrode 176, the driving drain electrode 177, the capacitor plate 178, and the common power line 172 are formed of the same conductive material. Although the data line 171 and the common power line 172 are adjacent to each other between adjacent pixels, the common power line 172 is formed on the surface 163 of the interlayer insulation layer 160 and the data line 171 is formed in the stepped portions 162 penetrating the interlayer insulation layer 160, thereby forming a level difference between the data line 171 and the common power line 172.

As such, by forming a level difference between the data line 171 and the common power line 172, the organic light emitting diode display device 104 according to the fourth exemplary embodiment prevents a short circuit between the data line 171 and the common power line 172 adjacent to each other, even when the interval between the data line 171 and the common power line 172 is small.

Moreover, even in the case where, before the formation of the data line 171 and the common power line 172 adjacent to each other, unwanted particles are located at positions at which the adjacent lines are to be formed, it is possible to prevent a short circuit between the data line 171 and the common power line 172 adjacent to each other due to the particles.

While the organic light emitting diode display device according to the first to fourth exemplary embodiments has been described with respect to the case where the data line 171 and the common power line 172 have a level difference therebetween, other exemplary embodiments can prevent a short circuit between other adjacent wiring portions by forming stepped portions in an insulation layer at the adjacent wiring portions in order to prevent a short circuit between other adjacent wiring portions made out of the same material by the same MEMS process, as well as between the data line 171 and the common power line 172.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a substrate;
an insulation layer arranged on the substrate and spaced apart from the substrate and including a plurality of stepped portions recessed from a top surface of the insulation layer;
a first line arranged on the top surface of the insulation layer;
a second line comprised of the same material as the first line and being arranged in the stepped portions and having a level difference from the first line; and
a thin film transistor that includes a source electrode arranged on the insulating layer and extending from the second line and receiving signals from the second line.

2. The display device of claim 1, wherein:
the thin film transistor further comprises an active layer covered by the insulation layer,
the insulation layer further comprises a plurality of through holes corresponding to the active layer and penetrating the insulation layer, and
the source electrode is connected to the active layer via one of the through holes.

3. The display device of claim 2, wherein the stepped portions are produced simultaneously with the through holes.

4. The display device of claim 2, wherein the stepped portions penetrate the insulation layer.

5. The display device of claim 2, wherein the insulation layer comprises:
a first sub-insulation layer arranged on the substrate; and
a second sub-insulation layer arranged on the first sub-insulation layer.

6. The display device of claim 5, wherein:
the second sub-insulation layer comprises first openings penetrating the second sub-insulation layer, and
the stepped portions are formed by the first openings.

7. The display device of claim 6, wherein:
the first sub-insulation layer comprises second openings penetrating the first sub-insulation layer, and
the stepped portions are formed by the first openings and the second openings.

8. The display device of claim 2, wherein:
the thin film transistor further comprises a drain electrode connected to the active layer, and
the display device further comprises:
a first electrode connected to the drain electrode;
an organic emission layer arranged on the first electrode; and
a second electrode arranged on the organic emission layer.

* * * * *